(12) United States Patent
Nandimandalam Venkata et al.

(10) Patent No.: US 12,155,308 B2
(45) Date of Patent: Nov. 26, 2024

(54) CURRENT PROTECTION FOR BATTERY CHARGER

(71) Applicant: TEXAS INSTRUMENTS INCORPORATED, Dallas, TX (US)

(72) Inventors: Karthik Nandimandalam Venkata, Dallas, TX (US); Siew Kuok Hoon, Plano, TX (US); Daniel Andrew Mavencamp, Rockwall, TX (US); Jairo Daniel Olivares, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 678 days.

(21) Appl. No.: 17/366,535

(22) Filed: Jul. 2, 2021

(65) Prior Publication Data

US 2021/0336468 A1    Oct. 28, 2021

Related U.S. Application Data

(62) Division of application No. 16/259,762, filed on Jan. 28, 2019, now Pat. No. 11,088,559.

(60) Provisional application No. 62/681,255, filed on Jun. 6, 2018.

(51) Int. Cl.
*H02M 3/158* (2006.01)
*G01R 19/165* (2006.01)
*H02J 7/00* (2006.01)

(52) U.S. Cl.
CPC .... *H02M 3/1582* (2013.01); *G01R 19/16542* (2013.01); *H02J 7/00712* (2020.01); *H02J 7/007184* (2020.01); *H02M 3/1584* (2013.01); *H02J 7/00304* (2020.01); *H02J 2207/20* (2020.01)

(58) Field of Classification Search
CPC .............. H02M 3/1582; H02M 3/1584; G01R 19/16542; H02J 7/00712; H02J 7/007184
USPC .................................. 320/137, 138, 140, 160
See application file for complete search history.

(56) References Cited

U.S. PATENT DOCUMENTS

| | | | |
|---|---|---|---|
| 5,504,406 A * | 4/1996 | Shultz ...................... | B60S 1/482 318/443 |
| 7,180,268 B2 * | 2/2007 | Denning ................ | H02J 7/0031 320/134 |
| 7,646,169 B2 * | 1/2010 | Liu ........................ | H02J 7/0031 320/135 |
| 8,030,900 B2 * | 10/2011 | Hussain ................ | H02J 7/0069 320/135 |
| 8,258,750 B2 | 9/2012 | Yamada | |

(Continued)

*Primary Examiner* — Richard V Muralidar
(74) *Attorney, Agent, or Firm* — Ray A. King; Frank D. Cimino (57) ABSTRACT

A device includes a battery current sense circuit configured to generate a battery current feedback voltage based on a current provided to a battery, a current regulation feedback loop configured to regulate the current provided to the battery based on the battery current feedback voltage and a configurable battery current reference voltage, and a precharge regulation feedback loop configured to regulate the current provided to the battery based on the battery current feedback voltage and a configurable precharge reference voltage. The device also includes a processor configured to set the battery current reference voltage to a first value and set the precharge current reference voltage to a second value. The first value is less than the second value during a transition state.

8 Claims, 6 Drawing Sheets

(56) References Cited

U.S. PATENT DOCUMENTS

| | | |
|---|---|---|
| 8,575,898 B2 | 11/2013 | Kitano et al. |
| 9,252,666 B2 | 2/2016 | Sakita |
| 9,853,467 B2 | 12/2017 | Kleine et al. |
| 10,790,682 B2 | 9/2020 | Hand et al. |
| 2006/0076934 A1 | 4/2006 | Ogata et al. |
| 2016/0352108 A1 | 12/2016 | Nakazawa |
| 2019/0372358 A1 | 12/2019 | El Markhi et al. |

* cited by examiner

CURRENT PROTECTION FOR BATTERY CHARGER

CROSS-REFERENCE TO RELATED APPLICATIONS

This divisional application claims priority to U.S. patent application Ser. No. 16/259,762, filed on Jan. 28, 2019, which claims the benefit of and priority to U.S. Provisional Application No. 62/681,255, filed on Jun. 6, 2018, both of which are incorporated herein by reference in their entirety.

SUMMARY

In accordance with at least one example of the disclosure, a device includes a battery current sense circuit configured to generate a battery current feedback voltage based on a current provided to a battery, a current regulation feedback loop configured to regulate the current provided to the battery based on the battery current feedback voltage and a configurable battery current reference voltage, and a precharge regulation feedback loop configured to regulate the current provided to the battery based on the battery current feedback voltage and a configurable precharge reference voltage. The device also includes a processor configured to set the battery current reference voltage to a first value and set the precharge current reference voltage to a second value. The first value is less than the second value during a transition state.

In accordance with another example of the disclosure, a method for charging a battery includes entering a transition state between a first charging state and a second charging state. A current provided to the battery during the first charging state is less than a current provided to the battery during the second charging state. The method also includes, during the transition state, controlling a transistor to regulate a current to the battery to a first value, and controlling a power converter to regulate the current to the battery to a second value. The first value is less than the second value.

In accordance with yet another example of the disclosure, a method for charging a battery includes operating a battery charger in a transition state by controlling a transistor to regulate a current to the battery to a first value, and controlling a power converter to regulate the current to the battery to a second value. The second value is less than the first value. The method also includes operating the battery charger in a battery current regulation state after the transition state by controlling the power converter to regulate the current to the battery to a third value, where the third value is greater than the second value.

BRIEF DESCRIPTION OF THE DRAWINGS

For a detailed description of various examples, reference will now be made to the accompanying drawings in which.

DETAILED DESCRIPTION

Various mobile electronic devices, such as smartphones and other mobile computing devices, are powered using batteries. Charging a battery is a difficult and possibly dangerous task, as overcharging can result in excessive temperatures, fires, or explosions, and undercharging can compromise long-term battery performance. In particular, large current spikes during battery charging are suboptimal for battery safety and performance.

A battery charging regulation circuit operates in different modes to regulate a voltage and current supplied to a battery during charging or a voltage supplied to the device system electronics (e.g., microprocessors). In many cases, such as when the battery is not being charged and an adapter is plugged in, the system voltage is regulated to a higher value than the battery charging voltage. Thus, when transitioning from a system voltage regulation mode to a battery voltage/current regulation mode, a large system capacitance is quickly discharged to a lower voltage level, resulting in a large spike in current supplied to the battery. Further, and as will be described more fully below with respect to FIG. 2, a voltage regulation feedback loop quickly switches from regulating (e.g., by comparing to a reference voltage) the system voltage to the battery voltage, which initially is very low since the battery is not being charged. Since the battery voltage is initially lower than the reference voltage to which it is being compared, the voltage regulation feedback loop temporarily controls a power converter to supply even more current, which adds to the current spike caused by the discharging of system capacitance.

Examples of the present disclosure include digital control logic that controls a battery charging regulation integrated circuit in a transition state (e.g., before entering a battery current regulation state) to mitigate the current spike explained above. In the transition state, the digital control logic causes a precharge regulation amplifier to control a battery transistor control terminal (e.g., a gate of a transistor) to regulate the current to the battery to a first level. At the same time, the digital control logic causes a current regulation amplifier to control a power converter to supply current to the battery at a second level, lower than the first level.

The precharge regulation amplifier only controls a transistor gate voltage, while the current regulation amplifier has a more complex circuitry path (e.g., propagation through a power converter controller and the power converter itself) to control the battery current. Thus, the precharge regulation amplifier bandwidth is larger (or response time shorter) relative to the current regulation amplifier, and initially and quickly regulates the battery current to the first level. This gives the current regulation amplifier time to take control of regulating the battery current to the second, lower level without permitting a sudden spike in current caused by discharge of a system capacitance. In some examples, the digital control logic then controls the battery charging regulation integrated circuit in a battery current regulation state and, since the current regulation amplifier is already active and controlling the power converter, the current to the battery increases without spiking. The battery charging regulation integrated circuit functionality and the transition state are explained below with respect to the accompanying figures.

Figure 1:
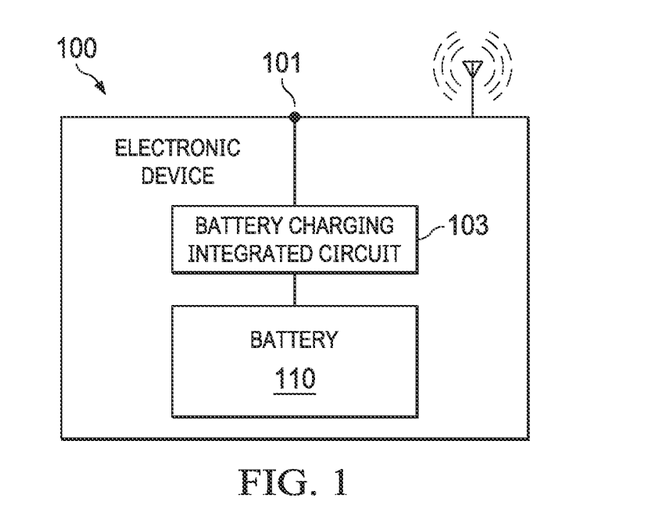
FIG. 1 shows a block diagram of an example battery-powered electronic device comprising a battery and an example battery charging integrated circuit (IC) in accordance with an example.

FIG. 1 depicts a block diagram of an example battery-powered electronic device 100, such as a mobile device (e.g., a smartphone). The electronic device 100 comprises a battery 110 and a battery charging integrated circuit (IC) 103 coupled to the battery 110. The battery 110 is any suitable type of battery that is capable of providing power to the electronic device 100 to enable the electronic device 100 to perform its intended functions. In an example, the battery charging IC 103 is a single chip housed inside a package. In an example, the battery charging circuitry is distributed across multiple chips, with all such chips housed inside a single package. Other variations on the precise configuration of the battery charging circuit are contemplated and included within the scope of this disclosure. The battery charging IC 103 couples to a port 101 to which a power supply can couple. For example, a user is able to connect the port 101 to mains power via an adapter. FIG. 1 is merely an example device in which the battery charging IC 103 can be implemented. Other applications, which include various other devices that use rechargeable batteries, will also find benefit with the battery charging IC 103.

In operation, the battery charging IC 103 receives power via the port 101 and uses the power to charge the battery 110. Specifically, the battery charging IC 103 implements the techniques alluded to above and described in greater detail below to achieve greater accuracy and precision in proxy current measurements when charging the battery 110. As explained, these techniques are especially helpful when charging of the battery 110 is nearly complete and the charging current has been reduced to a relatively small termination current that is difficult to accurately and precisely measure.

Figure 2:
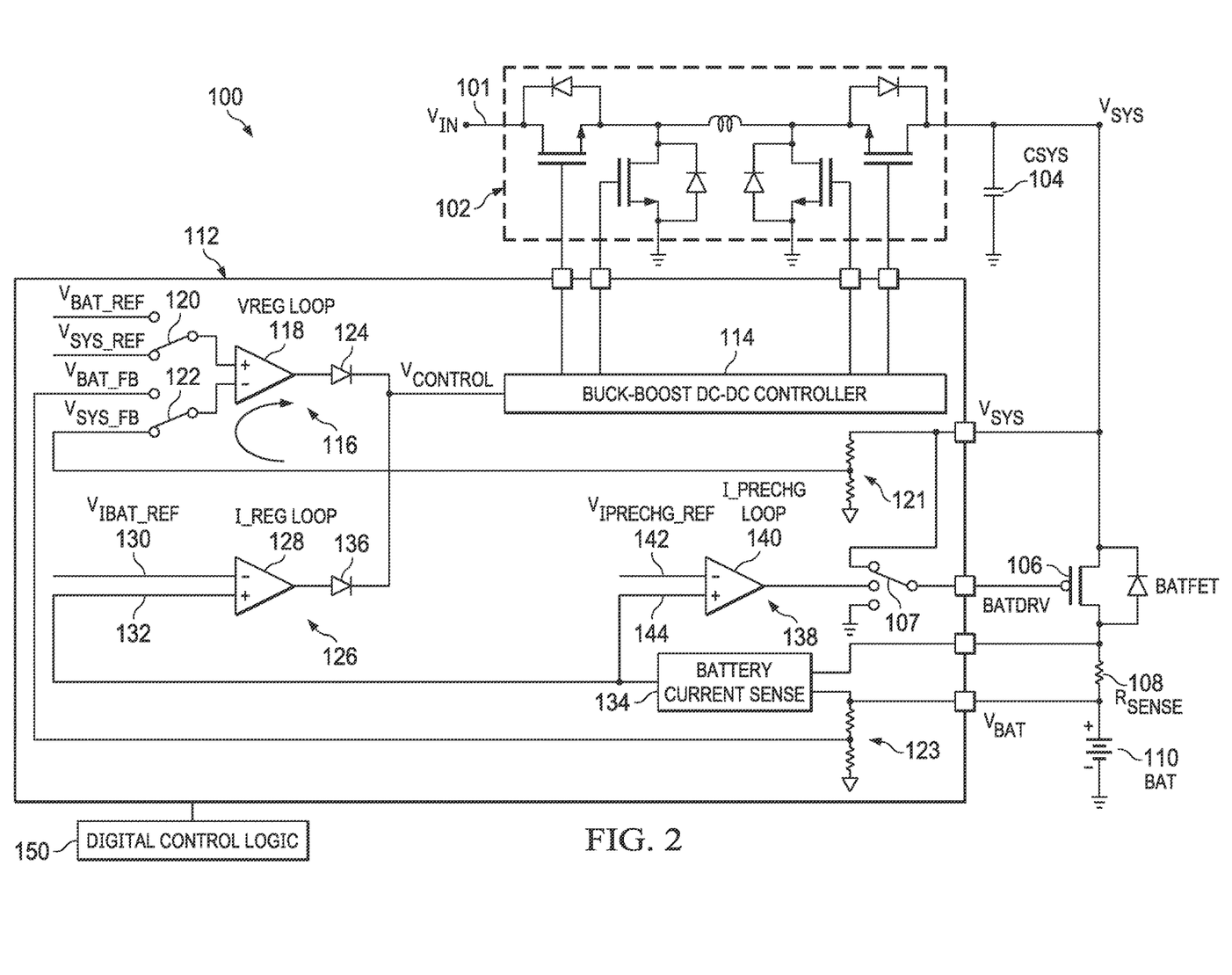
FIG. 2 shows a circuit schematic diagram of a battery, a power converter, and a battery charging regulation IC (BCR IC) in a system voltage regulation state in accordance with an example.

FIG. 2 shows a circuit schematic diagram including the battery 110 and at least some portions of the battery charging IC 103, particularly the portions related to regulating the charging characteristics (e.g., battery voltage, battery current, and a system voltage of the electronic device 100) for the battery 110 and the electronic device 100. A power converter 102 is coupled to the port 101 to receive an input voltage, for example from mains power via an adapter as explained above. An output of the power converter 102 provides a system voltage (VSYS) to the electronic device 100. The power converter 102 comprises a buck-boost converter as shown, but other examples that employ different power converter topologies are still within the scope of this disclosure. A system capacitor 104, which represents the capacitance of the electronic device 100 (CSYS), is coupled to the output of the power converter 102 and to ground.

A battery transistor 106 is also coupled to the output of the power converter 102 and to a current sense resistor 108. In this example, the battery transistor 106 is a p-type metal-oxide-semiconductor field effect transistor (MOSFET) having its gate coupled to a switch 107, which couples the gate to either VSYS, ground, or a precharge amplifier 140 output, which will be explained in further detail below. The battery transistor 106 controls a current flowing from the power converter 102 to the battery 110 and through the current sense resistor 108. The voltage applied to the battery 110 is notated as VBAT.

A battery charging regulation integrated circuit (BCR IC) 112 controls the operation of the power converter 102 and of the battery transistor 106. The BCR IC 112 includes a controller 114 for the power converter 102, which controls the power converter 102 (in this example, by controlling the gate voltages of transistors of the power converter 102) based on a received input voltage (VCONTROL). For example, an increase in VCONTROL causes the controller 114 to increase the current (and output voltage as a result) provided by the power converter 102, while a decrease in VCONTROL causes the controller 114 to reduce the current provided by the power converter 102.

A voltage regulation feedback loop 116 includes a voltage regulation amplifier 118 (e.g., a differential amplifier) that comprises two inputs: a first input 120 that is configured to receive a configurable reference voltage for either the battery 110 (VBAT_REF) or the electronic device 100 (VSYS_REF) and a second input 122 that is configured to receive either a system feedback voltage (VSYS_FB) or a battery feedback voltage (VBAT_FB). VBAT_REF is provided by a battery voltage reference voltage source while VSYS_REF is provided by a system voltage reference voltage source (voltage sources not shown for simplicity). In this example, VSYS_FB comprises VSYS divided by a voltage divider 121 and VBAT_FB comprises VBAT divided by a voltage divider 123. An output of the voltage regulation amplifier 118 is coupled to a blocking diode 124 (e.g., a transistor arranged as a source follower) and provides VCONTROL to the controller 114.

A current regulation feedback loop 126 includes a current regulation amplifier 128 (e.g., a differential amplifier) that comprises two inputs: a first input 130 that is configured to receive a configurable reference voltage (VIBAT_REF, provided by a battery current reference voltage source, not shown for simplicity), whose value is correlated to a value of current supplied to the battery 110, and a second input 132 that is configured to receive a voltage derived from the current supplied to the battery 110. For example, a battery current sense circuit 134 senses a voltage across the current sense resistor 108 and generates a battery current feedback voltage (VIBAT_FB) that is based on the voltage across the current sense resistor 108. An output of the current regulation amplifier 128 is coupled to a blocking diode 136 and also provides VCONTROL to the controller 114.

A precharge regulation feedback loop 138 includes a precharge regulation amplifier 140 (e.g., a differential amplifier) that comprises two inputs: a first input 142 that is configured to receive a configurable reference voltage (VIPRECHG_REF, provided by a precharge current reference voltage source, not shown for simplicity), whose value is correlated to a value of current supplied to the battery 110, and a second input 144 that is configured to receive the voltage from the battery current sense circuit 134, explained above. An output of the precharge regulation amplifier 140 is coupled to the switch 107, which selectively couples the output of the precharge regulation amplifier 140 to the gate of the battery transistor 106.

Digital control logic 150, which comprises one or more processors in an example, is coupled to the BCR IC 112 and is configured to control the inputs 120, 122, the switch 107 coupled to the gate of the battery transistor 106, and the configurable reference voltages VBAT_REF, VSYS_REF, VIBAT_REF, and VIPRECHG_REF. In another example, VIBAT_REF and VIPRECHG_REF are fixed voltages, while the feedback voltages themselves are configurable, for example through the use of different, controllable battery current sense circuits for the current regulation amplifier 128 and the precharge regulation amplifier 140. The scope of this disclosure is not limited to any particular approach to comparing a feedback voltage to a reference voltage.

In FIG. 2, the digital control logic 150 controls the BCR IC 112 in a system voltage regulation state in which VSYS is regulated to a particular value and the battery 110 is not being charged. The system voltage regulation state is useful, for example, when a power adapter is plugged into the port 101 and the battery 110 is fully charged, and thus only the electronic device 100 and any potential load on VSYS draws power. In the system voltage regulation state, the digital control logic 150 controls the switch 107 to couple the gate of the battery transistor 106 to a node at VSYS. In this example, since the battery transistor 106 is a p-type MOSFET, the battery transistor 106 is off and thus prevents current from flowing to the battery 110. Since there is no current flowing through the current sense resistor 108, the output of the battery current sense circuit 134 is a correspondingly low voltage. The precharge regulation feedback loop 138 is inactive because the switch 107 couples the gate of the battery transistor 106 to the node VSYS, which turns the battery transistor 106 fully off, and as a result no current flows to the battery 110. The current regulation feedback loop 126 is also inactive because the battery current sense circuit 134 output is lower than VIBAT_REF set by the digital control logic, and thus the output of the current regulation amplifier 128 is negative (and blocked by the blocking diode 136).

In the system voltage regulation state, the digital control logic 150 also controls the inputs 120, 122 of the voltage regulation feedback loop 116 such that the first input 120 provides VSYS_REF to the voltage regulation amplifier 118 and the second input 122 provides VSYS_FB to the voltage regulation amplifier 118. In the system voltage regulation state then, the voltage regulation amplifier 118 generates VCONTROL to cause the controller 114 to control the power converter 102 to regulate VSYS to a desired level. For example, if VSYS is below a desired level, then VSYS_FB will be less than VSYS_REF, causing the voltage regulation amplifier 118 to increase VCONTROL, which in turn causes the controller 114 to control the power converter 102 to increase its output voltage, VSYS. On the other hand, if VSYS is above the desired level, then VSYS_FB will be greater than VSYS_REF, causing the voltage regulation amplifier 118 to decrease VCONTROL, which in turn causes the controller 114 to control the power converter 102 to decrease its output voltage.

Figure 3:
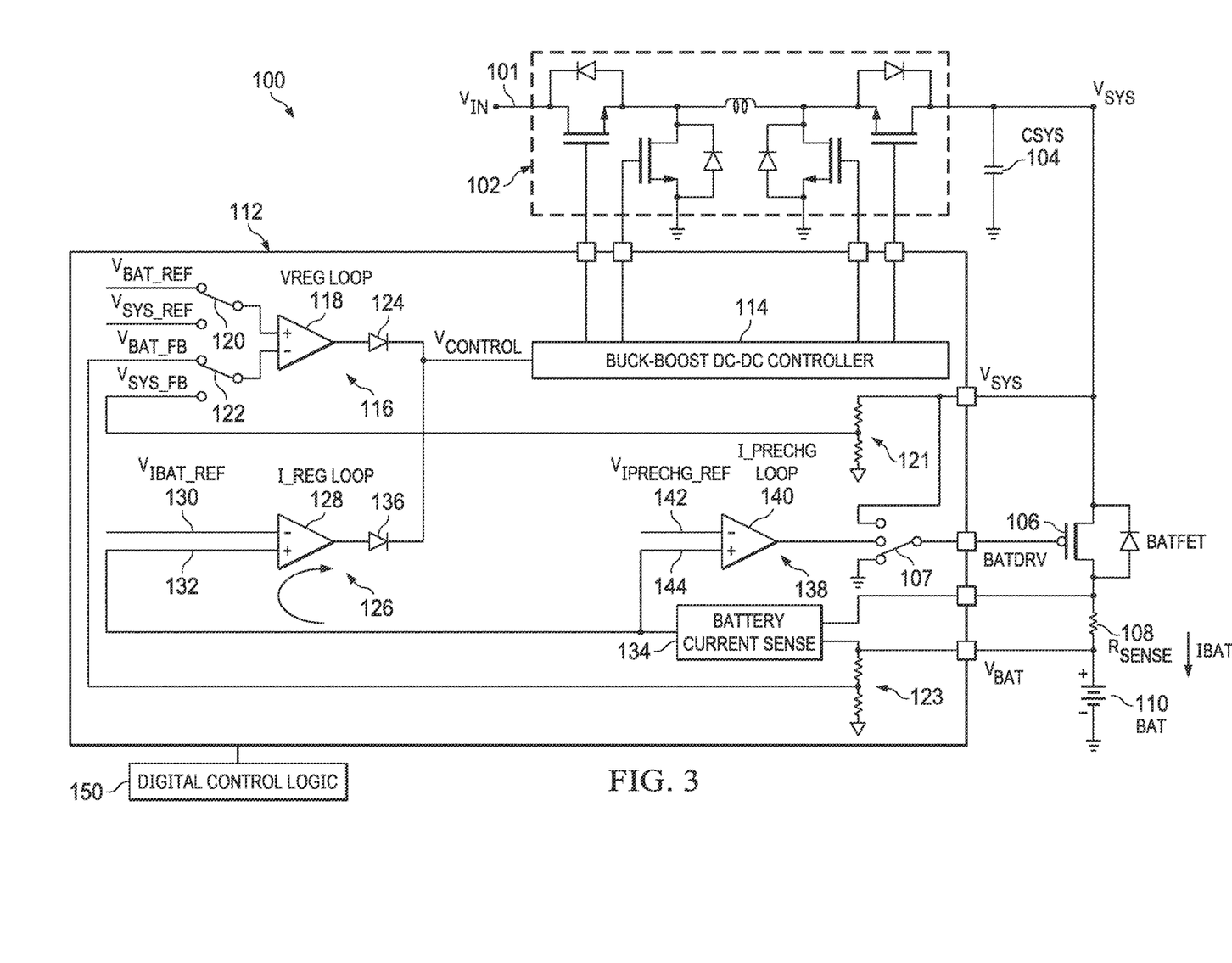
FIG. 3 shows a circuit schematic diagram of the battery, the power converter, and the BCR IC in a battery current regulation state in accordance with an example.

In FIG. 3, the digital control logic 150 controls the BCR IC 112 in a battery current regulation state in which current flowing to the battery 110 (IBAT) is regulated to a particular value while the battery 110 is being charged. In the battery current regulation state, the digital control logic 150 controls the switch 107 to couple the gate of the battery transistor 106 to ground. In this example, since the battery transistor 106 is a p-type MOSFET, the battery transistor 106 is on and thus permits current flowing to the battery 110. Since there is a current flowing through the current sense resistor 108, the output of the battery current sense circuit 134 is a voltage that corresponds to the amount of current flowing through the current sense resistor 108.

The digital control logic 150 also sets VIBAT_REF to a level corresponding to a desired amount of current to be supplied to the battery 110. For example, if IBAT is regulated to 1 amp (A), and that the current sense resistor has a resistance of 0.010, an input voltage to the battery current sense circuit 134 is 0.01 volt (V). In this example, the battery current sense circuit 134 is configured to generate an output that is eight times its input voltage, and thus generates an output voltage of 0.08V. Thus, VIBAT_REF would also be set to 0.08V, which corresponds to IBAT=1 Å.

In the battery current regulation state then, the current regulation amplifier 128 generates VCONTROL to the cause the controller 114 to control the power converter 102 to regulate IBAT to a desired level, if the current demanded by the voltage regulation feedback loop 116 is higher than the current set by the value of VIBAT_REF. For example, if the voltage regulation feedback loop 116 tries to supply more current to the battery 110 than what is set by the value of VIBAT_REF, the output of the battery current sense circuit 134 is greater than the value of VIBAT_REF. Thus, the battery regulation amplifier 128 output voltage increases and takes control of VCONTROL from the voltage regulation amplifier 118, in which the blocking diodes 124, 136 function as an analog OR gate. As a result, the controller 114 controls the power converter 102 to decrease its output current to the reference level determined by the value of VIBAT_REF. Alternatively, if the current demanded by the voltage regulation feedback loop 116 is less than the current limit set by the value of VIBAT_REF, the current regulation amplifier 128 output voltage is pulled down, rendering the current regulation feedback loop 126 inactive due to the analog OR blocking diodes 124, 136.

In the battery current regulation state, the digital control logic 150 also controls the inputs 120, 122 of the voltage regulation feedback loop 116 such that the first input 120 provides VBAT_REF to the voltage regulation amplifier 118 and the second input 122 provides VBAT_FB to the voltage regulation amplifier 118. In the battery current regulation state then, the voltage regulation amplifier 118 generates VCONTROL to cause the controller 114 to control the power converter 102 to regulate VBAT to a desired level. For example, if VBAT is below a desired level, then VBAT_FB will be less than VBAT_REF, causing the voltage regulation amplifier 118 to increase VCONTROL, which in turn causes the controller 114 to control the power converter 102 to increase its output voltage, which is related to VBAT. On the other hand, if VBAT is above the desired level, then VBAT_FB will be greater than VBAT_REF, causing the voltage regulation amplifier 118 to decrease VCONTROL, which in turn causes the controller 114 to control the power converter 102 to decrease its output voltage.

As explained above, in an example, VSYS is regulated to a higher value than VBAT. For example, VSYS is regulated to 4V, whereas a charging voltage for the battery 110 (VBAT during charging) is 3.8V. Thus, when transitioning from the system voltage regulation state shown in FIG. 2 to the battery current regulation state shown in FIG. 3, the system capacitor 104 is quickly discharged, resulting in a large spike in IBAT, the value of which in this example is CSYS*0.2V. Further, when the voltage regulation feedback loop 116 switches from comparing VSYS_FB to VSYS_REF to comparing VBAT_FB to VBAT_REF, VBAT_FB is initially much lower than VBAT_REF, which causes the voltage regulation amplifier 118 to increase VCONTROL to a high level, resulting in the power converter 102 supplying even greater current.

Figure 4:
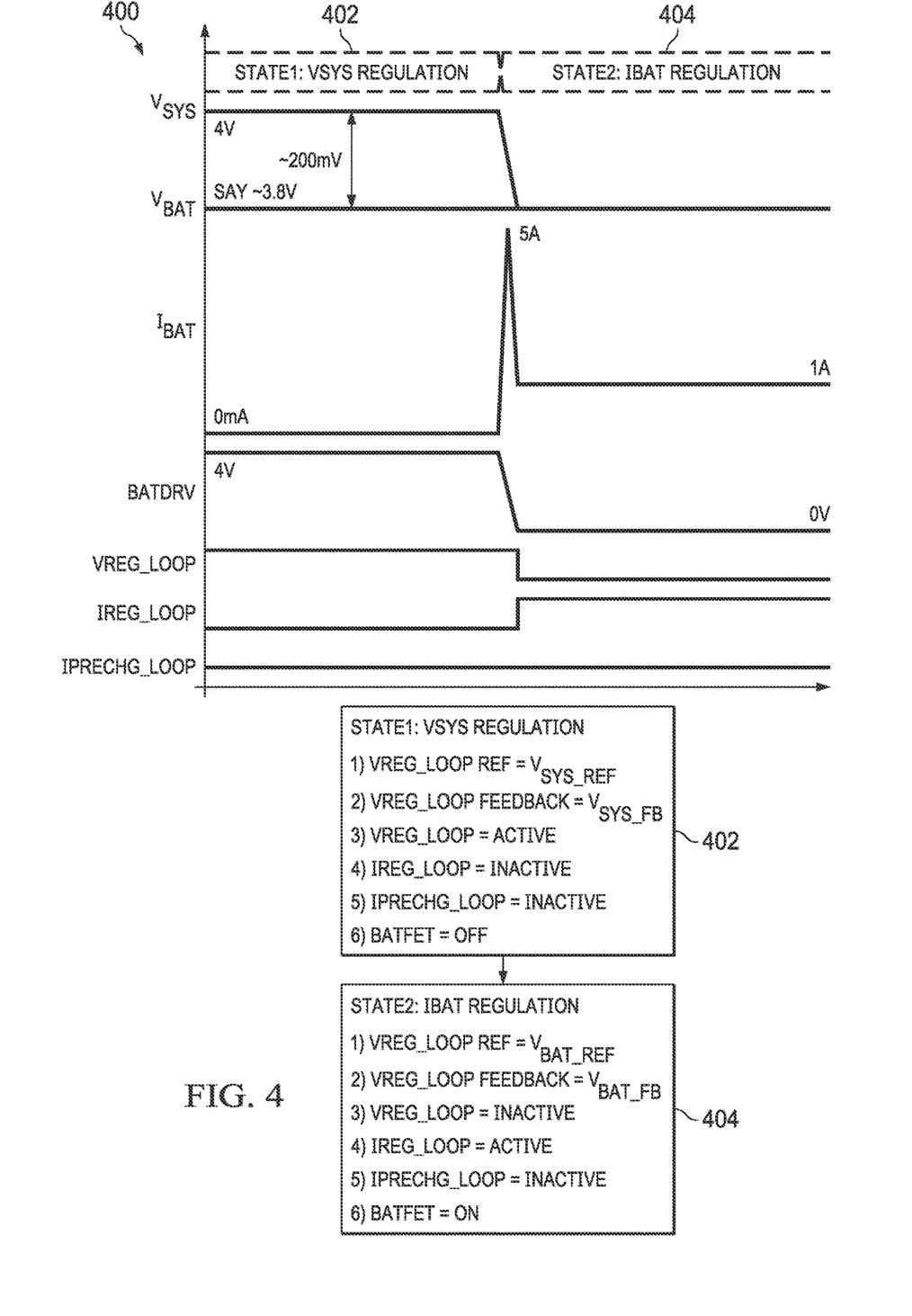
FIG. 4 shows a set of waveforms and an associated state diagram demonstrating the BCR IC switching from the system voltage regulation state to the battery current regulation state.

FIG. 4 shows a set of waveforms 400 that illustrates the transition from the system voltage regulation state shown in FIG. 2 to the battery current regulation state shown in FIG. 3, as well as the resulting IBAT spike. The VSYS waveform corresponds to the system voltage provided by the power converter 102. The VBAT waveform corresponds to the voltage on the battery 110. The IBAT waveform corresponds to the current provided to the battery 110. The BATDRV waveform corresponds to the gate voltage of the battery transistor 106. The VREG, IBAT_REG, and I_PRECHG LOOP waveforms demonstrate the active/inactive time of the voltage regulation loop 116, the current regulation feedback loop 126, and the precharge regulation feedback loop 138, respectively.

During the system voltage regulation state 402, VSYS is regulated to 4V while VBAT is 3.8V; IBAT is 0 since the gate of the battery transistor 106 (BATFET) is coupled to the node at VSYS and thus the battery transistor 106 is off. Subsequently, when transitioning to the battery current regulation state 404, VSYS drops from 4V to approximately 3.8V, or the value to which VBAT is regulated in the battery current regulation state 404. This causes the system capacitor 104 to quickly discharge, generating an IBAT spike corresponding to the charge on the capacitor 104, which is equal to CSYS*0.2V. Further, as explained above, the initial behavior of the voltage regulation loop 116 to regulate VBAT additionally increases the magnitude of the IBAT spike.

Figure 5:
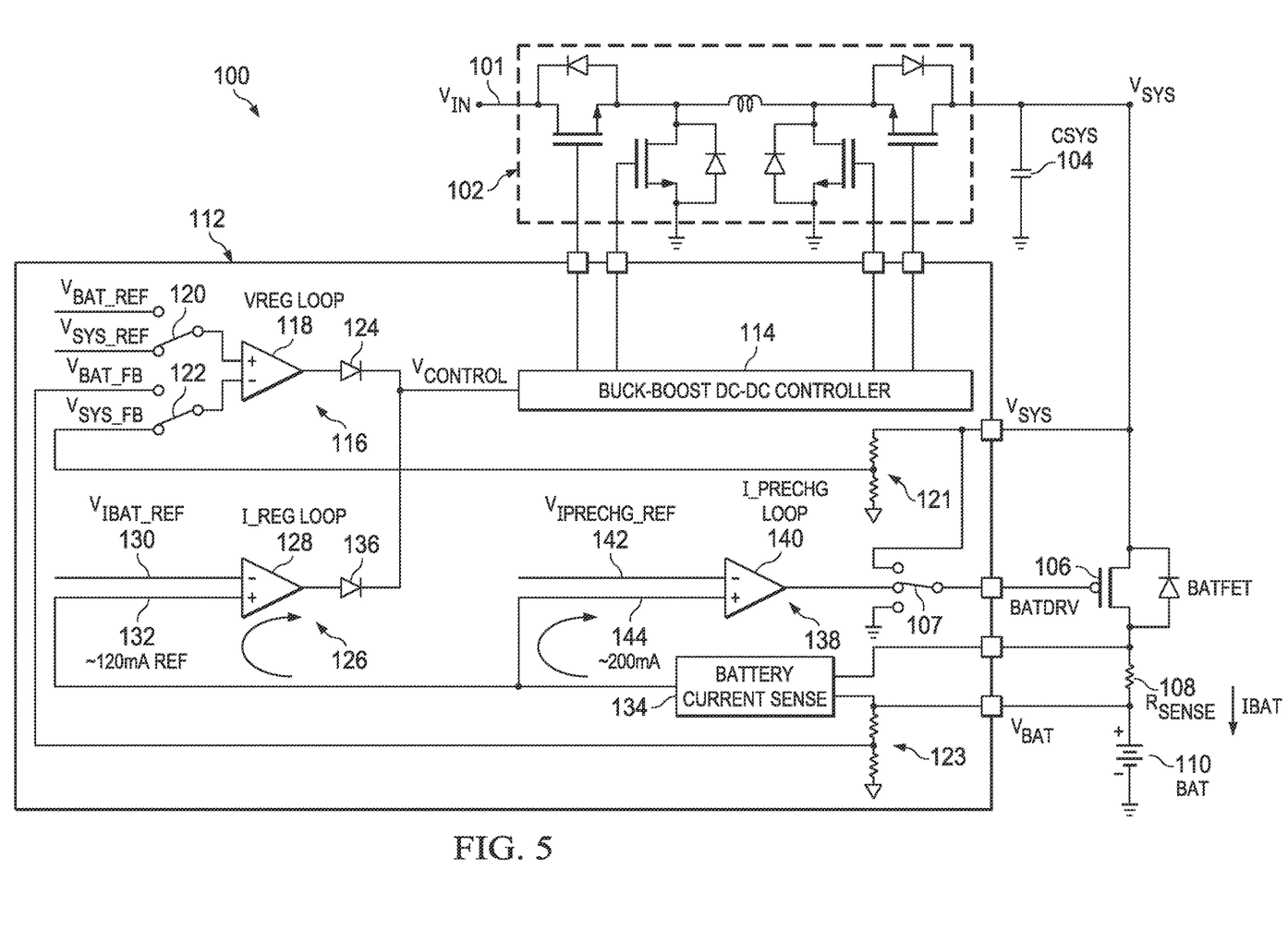
FIG. 5 shows a circuit schematic diagram of the battery, the power converter, and the BCR IC in a transition state in accordance with an example.

FIG. 5 shows the digital control logic 150 controlling the BCR IC 112 in a transition state to mitigate the current spike issues described above. In the transition state, the digital control logic 150 controls the switch 107 to couple the gate of the battery transistor 106 the output of the precharge regulation amplifier 140. The digital control logic 150 also sets VIPRECHG_REF to a level corresponding to a desired limit of current to be supplied to the battery 110 in the transition state (e.g., 200 milliamp (mA)). Since the precharge regulation amplifier 140 also receives as input the output of the battery current sense circuit 134, the precharge regulation amplifier 140 regulates the gate voltage of the battery transistor 106 to limit IBAT based on the value of VIPRECHG_REF.

At the same time, the digital control logic 150 also sets VIBAT_REF to a level corresponding to a desired amount of current to be supplied to the battery 110 in the transition state (e.g., 120 mA). Since the value of VIBAT_REF during this time corresponds to a lower current than that of VIPRECHG_REF, the current regulation feedback loop 126 becomes active since it is trying to regulate IBAT to a lower value than that set by the precharge regulation feedback loop 138. Thus, the controller 114 is controlled by VCONTROL to supply less current than set by the value of VIPRECHG_REF, or to decrease the VSYS voltage as a result, which discharges the system capacitor 104. The precharge regulation amplifier 140 need only control the gate voltage of the battery transistor 106 to influence IBAT, whereas the current regulation amplifier 128 output has a more complex circuitry path (e.g., propagation through the controller 114 and the power converter 102) to influence IBAT. As a result, a bandwidth is larger (or response time shorter) of the precharge regulation feedback loop 138 relative to the current regulation feedback loop 126, and IBAT is initially limited by the value of VIPRECHG_REF (e.g., to 200 mA) and then limited by the value of VIBAT_REF (e.g., to 120 mA) once the current regulation feedback loop 126 has taken control to regulate VCONTROL and thus the controller 114 and power converter 102.

In the transition state, the digital control logic 150 also controls the inputs 120, 122 of the voltage regulation feedback loop 116 such that the first input 120 provides VSYS_REF to the voltage regulation amplifier 118 and the second input 122 provides VSYS_FB to the voltage regulation amplifier 118. As explained above, the blocking diodes 124 and 136 act as an analog OR circuit that determines whether the voltage regulation amplifier 118 or the battery current regulation amplifier 128 controls VCONTROL. In the transition state, VCONTROL is controlled by the voltage regulation amplifier 118 initially, and subsequently is controlled by the battery current regulation amplifier 128 once it has taken control to limit IBAT (based on the bandwidth-related delay explained above).

The system capacitor 104 does not initially discharge as the voltage regulation feedback loop 116 initially is active to regulate VSYS, thus maintaining the charge on the system capacitor 104. However, the precharge regulation feedback loop 138 initially controls IBAT due to its faster response time and thus gives the current regulation feedback loop 126 time to overcome the bandwidth-related delay to take control of VCONTROL. Once the current regulation feedback loop 126 takes control of VCONTROL, the system capacitor 104 discharges although IBAT is regulated by the current regulation feedback loop 126 controlling the power converter 102 via the output of the current regulation amplifier 128 VCONTROL and the controller 114. After a time period in the transition state (e.g., sufficient to allow for system capacitor 104 discharge and for the current regulation feedback loop 126 to take control), the digital control logic 150 controls the BCR IC 112 to enter the battery current regulation state described above with respect to FIG. 3. The digital control logic 150 first controls the BCR IC 112 in the system voltage regulation state as described with respect to FIG. 2, then controls the BCR IC 112 to enter the transition state described with respect to FIG. 5, then controls the BCR IC 112 to enter the battery current regulation state described with respect to FIG. 3.

Although the above describes the transition from a system voltage regulation state, to a transition state, to a battery current regulation state, the transition state described herein is applicable to other circumstances as well. In one example, the BCR IC 112 is initially in a battery precharge regulation state, in which the precharge regulation feedback loop 138 is regulating IBAT by controlling the battery transistor 106 and the voltage regulation feedback loop 116 is regulating VSYS. Then, prior to switching to a battery current regulation state, the digital control logic 150 controls the BCR IC 112 to enter the transition state described with respect to FIG. 5.

Figure 6:
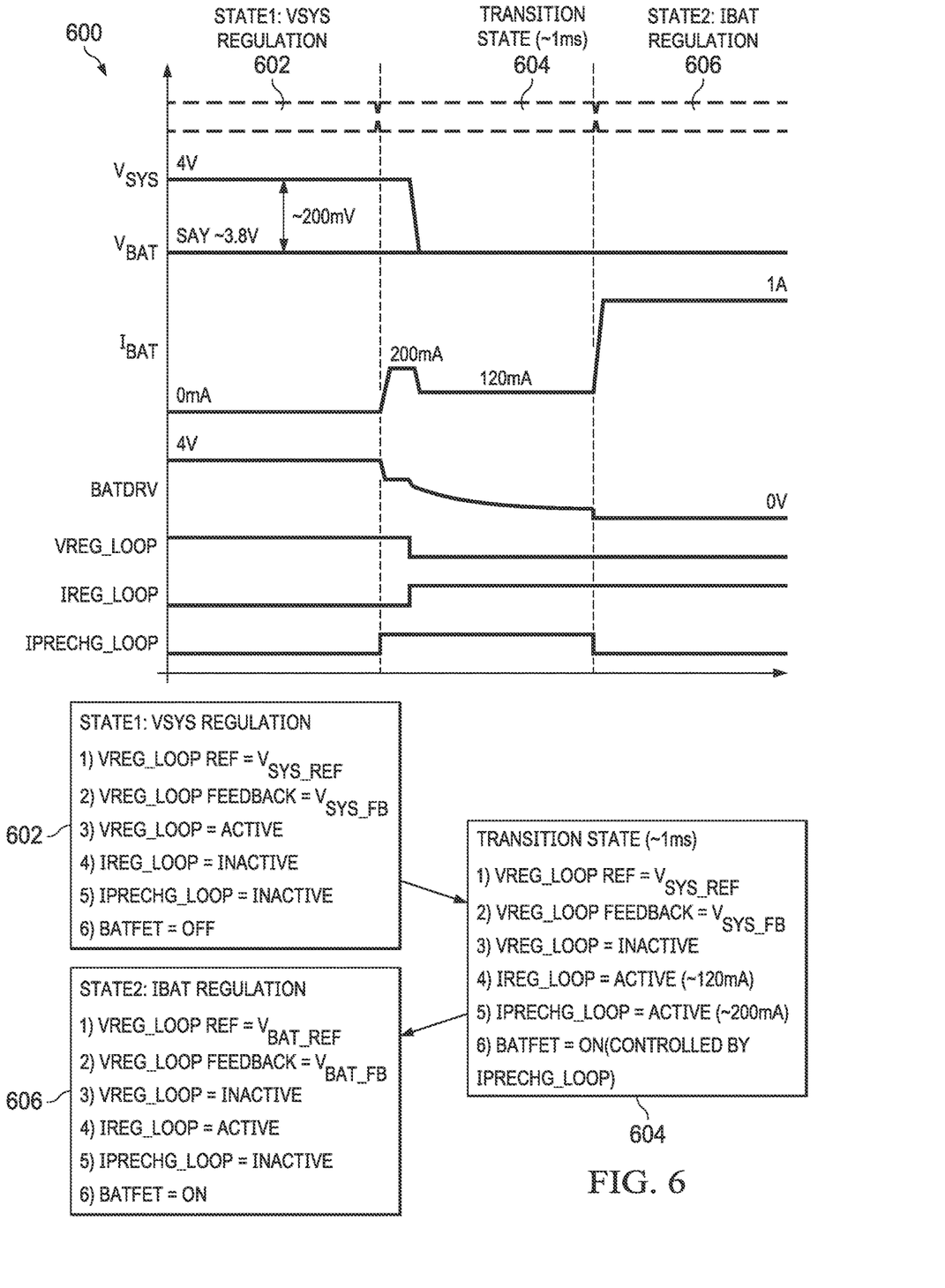
FIG. 6 shows a set of waveforms and an associated state diagram demonstrating the BCR IC switching from the system voltage regulation state, to the transition state, to the battery current regulation state in accordance with an example.

FIG. 6 shows a set of waveforms 600 that illustrates the transition from the system voltage regulation state shown in FIG. 2, to the transition state shown in FIG. 5, to the battery current regulation state shown in FIG. 3, as well as the resulting lack of spike in IBAT. The VSYS waveform corresponds to the system voltage provided by the power converter 102. The VBAT waveform corresponds to the voltage on the battery 110. The IBAT waveform corresponds to the current provided to the battery 110. The BATDRV waveform corresponds to the gate voltage of the battery transistor 106. The VREG, IBAT_REG, and I_PRECHG LOOP waveforms demonstrate the active/inactive time of the voltage regulation loop 116, the current regulation feedback loop 126, and the precharge regulation feedback loop 138, respectively.

As above with respect to FIG. 4, during the system voltage regulation state 602, VSYS is regulated to 4V while VBAT is 3.8V; IBAT is 0 since the gate of the battery transistor 106 (BATFET) is coupled to the node at VSYS and thus the battery transistor 106 is off. However, rather than transitioning directly to the battery current regulation state as in FIG. 4, in FIG. 6, the digital control logic 150 first controls the BCR IC 112 in a transition state 604.

As explained with respect to FIG. 5, the digital control logic 150 sets VIPRECHG_REF to a level corresponding to a desired limit of current to be supplied to the battery 110 in the transition state (e.g., 200 mA), and BATDRV is regulated accordingly. The digital control logic 150 also sets VIBAT_REF to a level corresponding to a desired amount of current to be supplied to the battery 110 in the transition state (e.g., 120 mA), which in examples is lower than the limit set by VIPRECHG_REF. Due to the bandwidth-related delay of the current regulation feedback loop 126, the current regulation feedback loop 126 is initially inactive, demonstrated by the IBAT_REG LOOP waveform. During this time, VSYS is maintained by the voltage regulation feedback loop 116 and the system capacitor 104 remains charged, while IBAT is regulated by the battery transistor 106 and the precharge amplifier 140.

Once the current regulation feedback loop 126 takes control due to being configured to regulate IBAT to a lower level than is being permitted by the precharge regulation feedback loop 138, the system capacitor 104 is discharged although IBAT is regulated by the current regulation feedback loop 126. Additionally, IBAT decreases because the current regulation feedback loop 126 is set to regulate IBAT to a lower level than IBAT was limited to by the battery transistor 106. When the current regulation feedback loop 126 becomes active, the current regulation amplifier 128 regulates VCONTROL to cause the controller 114 to cause the power converter 102 to supply the desired IBAT value of 120 mA in this example. The precharge amplifier 140 continues to pull BATDRV lower to attempt to maintain an IBAT of 200 mA.

Once the current regulation feedback loop 126 is active, the system capacitor 104 is discharged, and in some examples BATDRV has been pulled sufficiently low, the digital control logic 150 controls the BCR IC 112 in a battery current regulation state 606. The current regulation feedback loop 126 is already active, avoiding the bandwidth issues explained above that led to a current spike, and the digital control logic 150 sets VIBAT_REF to a level corresponding to a desired amount of current to be supplied to the battery 110 in the battery current regulation state 606 (e.g., 1A). Unlike in FIG. 4, the system capacitor 104 is already discharged and thus a current spike is avoided. The precharge loop 138 is rendered inactive by coupling the gate of the battery transistor 106 to ground, fully turning on the battery transistor 106.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means+1-10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A method for charging a battery, comprising:
   entering a transition state between a first charging state and a second charging state, wherein a current provided to the battery during the first charging state is less than a current provided to the battery during the second charging state; and
   during the transition state:
      controlling a transistor to regulate a current to the battery to a first value; and
      controlling a power converter to regulate the current to the battery to a second value,
      wherein the first value is less than the second value.

2. The method of claim 1 wherein the current provided to the battery during the second charging state is greater than the first value and the second value.

3. The method of claim 1 wherein during the first state, the method further comprises:
   controlling the power converter to regulate a system voltage; and
   controlling the transistor to prevent current from flowing to the battery.

4. The method of claim 1 wherein during the first state, the method further comprises:
   controlling the power converter to regulate a system voltage; and
   controlling the transistor to allow current to flow to the battery.

5. The method of claim 1 wherein during the third state, the method further comprises:
   controlling the power converter to regulate a battery voltage; and
   controlling the power converter to regulate the current to the battery to a value greater than the second value.

6. A method for charging a battery, comprising:
   operating a battery charger in a transition state by:
      controlling a transistor to regulate a current to the battery to a first value; and
      controlling a power converter to regulate the current to the battery to a second value, wherein the second value is less than the first value; and
   operating the battery charger in a battery current regulation state after the transition state by controlling the power converter to regulate the current to the battery to a third value, wherein the third value is greater than the second value.

7. The method of claim 6 further comprising:
operating the battery charger in a system voltage regulation state before the transition state by:
controlling the power converter to regulate a system voltage; and
controlling the transistor to prevent current from flowing to the battery.

8. The method of claim 6 wherein during the first state, the method further comprises:
operating the battery charger in a precharge regulation state before the transition state by:
controlling the power converter to regulate a system voltage; and
controlling the transistor to allow current to flow to the battery.

* * * * *